United States Patent
Kobayashi et al.

[11] Patent Number: 6,137,395
[45] Date of Patent: Oct. 24, 2000

[54] MAGNETORESISTOR WITH ORDERED DOUBLE PEROVSKITE STRUCTURE AND METHOD FOR THE PRODUCTION THEREOF

[75] Inventors: Keiichiro Kobayashi, Tokyo; Yoshinori Tokura, Tsukuba; Tsuyoshi Kimura, Tsukuba; Yasuhide Tomioka, Tsukuba, all of Japan

[73] Assignees: Agency of Industrial Science and Technology, Ministry of International Trade and Industry; Mitsubishi Electric Corporation; Angstrom Technology Partnership, all of Tokyo, Japan

[21] Appl. No.: 09/277,223

[22] Filed: Mar. 26, 1999

[30] Foreign Application Priority Data

Mar. 27, 1998 [JP] Japan ................................ 10-81284
Oct. 16, 1999 [JP] Japan ................................ 10-295810

[51] Int. Cl.$^7$ ................................................ H01L 43/00
[52] U.S. Cl. ................................ 338/32 R; 338/32 R
[58] Field of Search ................ 338/32 R, 32 H, 338/32 S, 12; 505/881

[56] References Cited

U.S. PATENT DOCUMENTS 3,848,217  11/1974  Lazzari .................................. 338/32 R

FOREIGN PATENT DOCUMENTS 6-237022  8/1994  Japan.

OTHER PUBLICATIONS

Mitsuru Itoh, et al., Materials Science & Engineering, p. 55–58, "Valency Pair and Properties of 1:1 Ordered Perovskite–Type Compounds $Sr_2MMoO_6$(M=Mn,Fe,Co)" 1996 (no month).

Itoh et al. Materials Science and Engineering, B41 (1996) p.55–58, 1996.

*Primary Examiner*—Lincoln Donovan
*Assistant Examiner*—Kyung S. Lee
*Attorney, Agent, or Firm*—Oblon, Spivak, McClelland, Maier & Neustadt, P.C.

[57] ABSTRACT

A magnetoresistor with an ordered double perovskite structure is an oxide crystal which has an ordered double perovskite crystal structure represented by the general formula of $A_2BB'O_6$, wherein A stands for Sr atoms, B for Fe atoms and B' for Mo or Re atoms and wherein the Fe atoms and the Mo or Re atoms are alternately arranged and which exhibits negative magnetoresistive characteristics.

3 Claims, 7 Drawing Sheets

MAGNETORESISTOR WITH ORDERED DOUBLE PEROVSKITE STRUCTURE AND METHOD FOR THE PRODUCTION THEREOF

BACKGROUND OF THE INVENTION

1. Field of the Invention

The present invention relates to a magnetoresistive element (magnetoresistor) with an ordered double perovskite structure and a method for producing the same. More particularly, the present invention relates to a magnetoresistor which is an oxide crystal with an ordered double perovskite crystal structure, that has electrical conductivity, is enhanced in magnetic-conductance and spin-polarization characteristics, and is advantageously usable as a probe of a spin-polarization scanning type tunneling microscope or a magnetoresistor operable at room temperature, and to a method for the production of the oxide crystal.

2. Description of the Prior Art

An attention has recently been paid again to the physical properties of a transition metal oxide having a perovskite type crystal structure since the discovery of a high-temperature copper oxide superconductor. There have been made, for example, keen studies on a manganese oxide crystal in which a negative huge magnetoresistive phenomenon occurs. In conventional manganese oxide crystals, the magnetoresistive phenomenon has been remarkably observed particularly in a single crystal having no intergranularity.

In addition, there has heretofore been known an oxide with an ordered double perovskite type structure represented by the chemical formula of $Sr_2FeMoO_6$ or $Sr_2FeReO_6$. The crystal structure, magnetic property, etc. thereof have been studied, and it has been reported that the curie temperature thereof is in the vicinity of 400 K. that is much higher than room temperature. However, it has not been known that the oxide manifests a negative huge magnetoresistive effect.

Although it has been reported that the conventional manganese oxide single crystal manifests a negative magnetoresistive effect only in the vicinity of its magnetic transition temperature that is within a temperature range of room temperature to 2 K., there are few reports on an oxide ceramic that manifests a magnetoresistive effect over the entire temperature range and is easy to produce.

The present invention has been proposed in view of the above.

An object of the present invention is to provide a magnetoresistor that manifests a magnetoresistive effect over an entire temperature range.

Another object of the present invention is to provide a method for producing the magnetoresistor more easily than a conventional single-crystal producing method.

SUMMARY OF THE INVENTION

To attain the objects, according to the present invention there is provided a magnetoresistor with an ordered double perovskite structure that is an oxide crystal:

which has an ordered double perovskite crystal structure represented by the general formula of $A_2BB'O_6$, wherein A stands for Sr atoms, B for Fe atoms and B' for Mo or Re atoms and wherein the Fe atoms and the Mo or Re atoms are alternately arranged, and which exhibits negative magnetoresistive characteristics.

The Fe atoms and the Mo or Re atoms have a degree of alternate arrangement that is not less than 20%.

According to the present invention there is also provided a method for producing an oxide having an ordered double perovskite crystal structure represented by a composition of $Sr_2FeReO_6$, comprising the steps of weighing, mixing and forming raw material powders in a glove compartment to obtain a desired shaped article having the composition, sealing the article in an evacuated silica capsule, calcining the article within the silica capsule at a temperature of about 900° C., primarily sintering the calcined article at a temperature of not less than 1100° C., and heat-treating the sintered article in a stream of inert gas at a temperature of not less than 1125° C.

The present invention further provides an electronic device switching method comprising the step of applying a magnetic field to an oxide crystal having an ordered double perovskite crystal structure represented by the general formula of $A_2BB'O_6$, wherein A stands for Sr atoms, B for Fe atoms and B' for Mo or Re atoms and wherein the Fe atoms and the Mo or Re atoms are alternately arranged, thereby affording negative magnetoresistive characteristics to the oxide crystal.

The above and other objects, features and advantages of the present invention will become apparent from the description made with reference to the accompanying drawings.

DESCRIPTION OF THE PREFERRED EMBODIMENTS

The inventors made various studies on perovskite oxide crystals and found a rare phenomenon that occurred in an oxide ceramic. That is to say, in an oxide crystal having an ordered double perovskite crystal structure represented by the chemical formula of $Sr_2FeMoO_6$ or $Sr_2FeReO_6$, a negative huge magnetoresistive effect is manifested over an entire temperature range of not more than the vicinity of room temperature to 4 K. The present invention has been perfected as the result of this knowledge.

Further theoretical studies conducted on the metallic electroresistance-temperature characteristics revealed that the oxide crystal had an electronic structure that exhibits a spin-polarization rate of 100% at a cryogenic temperature.

The inventors also made studies on a method for producing an oxide having an ordered double perovskite crystal structure represented by the chemical formula of $Sr_2FeMoO_6$. As a result, they found that the oxide manifested a negative huge magnetoresistive effect when produced by weighing and mixing raw oxide materials into an article having a desired composition, calcining the article at a temperature of approximately 900° C., primarily sintering the calcined article in a reducing atmosphere at a temperature of 1100° C. to 1300° C. for 1 hour to 20 hours.

It was found that when an oxide having a curie temperature of not less than room temperature and represented by $Sr_2FeMoO_6$ was sintered in a reducing atmosphere at a temperature of 1100° C. to 1300° C., the Fe atoms and the Mo atoms in the perovskite crystal structure were alternately arranged to obtain an oxide ceramic having an electronic structure exhibiting a negative magnetoresistive characteristic over an entire temperature of not more than the vicinity of room temperature to 4 K. and a spin-polarization rate of 100% at a cryogenic temperature.

As a consequence of further studies on a method for producing an oxide having an ordered double perovskite crystal structure represented by a composition of $Sr_2FeReO_6$, the inventors found that the oxide obtained by weighing, mixing and forming raw oxide materials within a glove compartment to obtain a desired shaped article having the composition, sealing the article in an evacuated silica capsule, effecting calcining treatment at about 900° C. and primary sintering treatment at not less than 1100° C. of the article in the silica capsule, and heat-treating the resultant article in a stream of inert gas such as highly pure argon gas at not less than 1125° C. manifested a negative huge magnetoresistive characteristic over an entire temperature range of not more than room temperature. While it was known that Re is an element having high volatility, it was confirmed by the elementary analysis that the article subjected to the calcining and primary sintering treatments had the composition ratio of Sr, Fe and Re coincident with the theoretical value of 2:1:1 even when the subsequent heat-treatment in the stream of inert gas was carried out.

It was also found that when an oxide having a curie temperature of not less than room temperature and represented by $Sr_2FeReO_6$ was calcined in an evacuated sealed silica capsule at about 900° C., primarily sintered therein at not less than 1100° C. and heat-treated in a stream of highly pure argon gas at not less than 1125° C., the Fe atoms and the Re atoms in the perovskite crystal structure were alternately arranged to obtain an oxide ceramic having an electronic structure exhibiting a negative huge magnetoresistive characteristic over an entire temperature of not more than the vicinity of room temperature to 2 K. and a spin-polarization rate of 100% at a cryogenic temperature.

Figure 10:
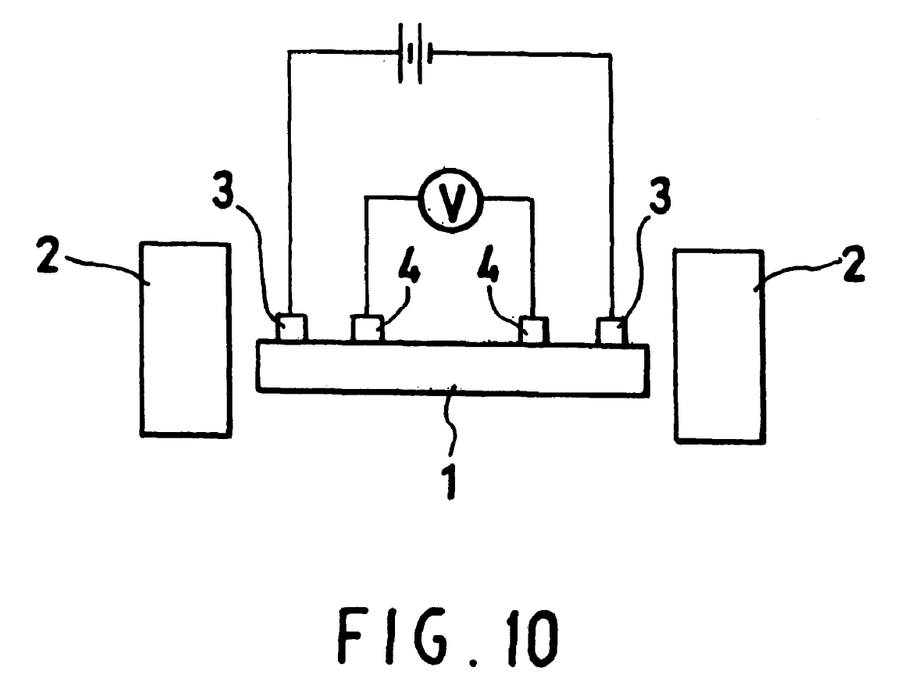
FIG. 10 is a schematic view of the magnetoresistor of the present invention tested by the four-terminal test method.

A magnetoresistance switching device can be tested using a four-terminal test method, as shown in FIG. 10. In this test method, the oxide polycrystal 1 of the present invention is disposed between a pair of electromagnets, 2. A pair of electrodes, 3, to which an electric current is applied are formed on the polycrystal. Another pair of electrodes, 4, formed on the polycrystal inside the pair of electrodes 3, is provided for the purpose of measuring the voltage or resistance value of the polycrystal. When an electric current is supplied to the polycrystal via the electrodes 3, the polycrystal exhibits poor electrical conductivity. When a magnetic field is applied to the polycrystal, the poorly conductive state of the polycrystal is transformed into a metallic or conductive state, causing the voltage or resistance value measured at electrodes 4 on the polycrystal to vary. This variation in voltage or resistance value may be exploited to cause a switching action.

As is clear from the above, the present invention provides a magnetoresistor with an ordered double perovskite crystal structure, that is an oxide crystal which has an ordered double perovskite crystal structure represented by the general formula of $A_2BB'O_6$ wherein A stands for Sr atoms, B for Fe atoms and B' for Mo or Re atoms and wherein the Fe atoms and the Mo or Re atoms are alternately arranged, which exhibits negative magnetoresistive characteristics, which has a magnetic transition temperature that is higher than room temperature, which has an electronic structure exhibiting a spin-polarization rate of 100% at a cryogenic temperature and a magnetoresistive effect at an entire temperature of room temperature to a cryogenic temperature, which is a polycrystal easier to produce in comparison with a conventional manganese oxide single crystal, and which is put to practical use with considerable effectiveness as a magnetic sensor operable at room temperature, a probe of a spin-polarization scanning type tunneling microscope, etc.

Working examples and comparative experiments will be described hereinafter.

WORKING EXAMPLE 1

Fully dried raw materials of $SrCo_3$, $Fe_2O_3$ and $MoO_3$ were weighed so that a composition of $Sr_2FeMoO_6$ could be obtained. These materials were mixed using an agate mortar and molded under a pressure of about 0.3 ton to 1.0 ton/cm$^2$ into a disc 10 mm in diameter and 1 mm in thickness.

It was confirmed that the same result could be obtained when a mixture of SrO, $MoO_2$, $MoO_3$ and Mo powder was used in place of the aforementioned raw materials.

The disc thus obtained was calcined at 900° C. for 3 hours and then cooled to room temperature. The resultant disc was pulverized minutely and then re-molded into a second disc 10 mm in diameter and 1 mm in thickness under a pressure of about 0.3 ton to 1.0 ton/cm$^2$.

It was confirmed that the same result could be obtained when the raw materials all in the form of powder were calcined at 900° C. without being molded into a second disc.

The second disc was sintered at 1150° C. in a stream of argon gas containing 7% of $H_2$ gas for 2 hours, then cooled to room temperature, thereafter taken out, and cut into square pole samples measuring about 1 mm×1 mm×5 mm for measurement of electroresistivity.

It was confirmed that the same result could be obtained even when the content of $H_2$ gas in the argon gas was in the range of 0.5% to 7%.

Figure 3:
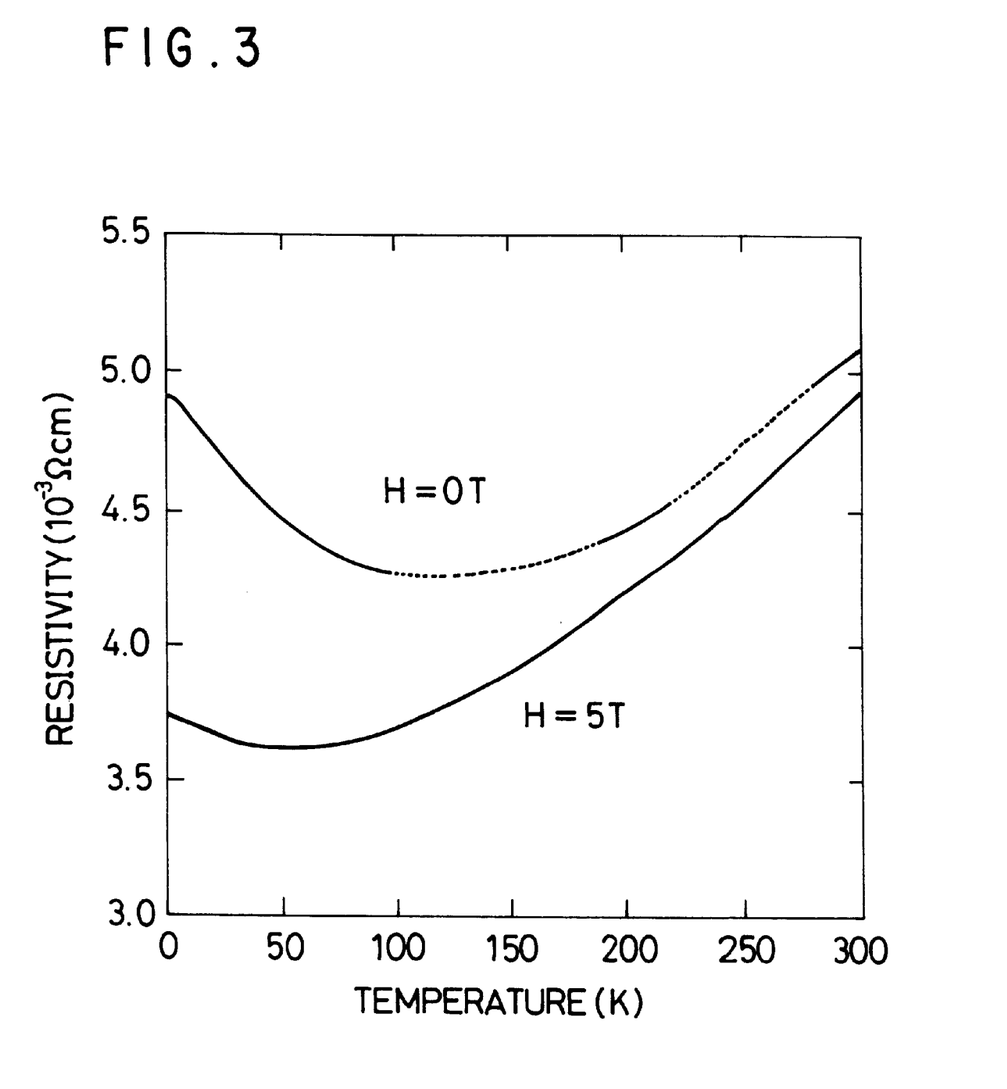
FIG. 3 is a graph showing the temperature dependency of the electroresistivity of the magnetoresistor at a temperature range of 4.2 K. to 300 K.

A polycrystal oxide ceramic sample was assayed for temperature dependency of electroresistivity using the direct-current four-terminal method to obtain metallic results as shown in FIG. 3.

Figure 1:
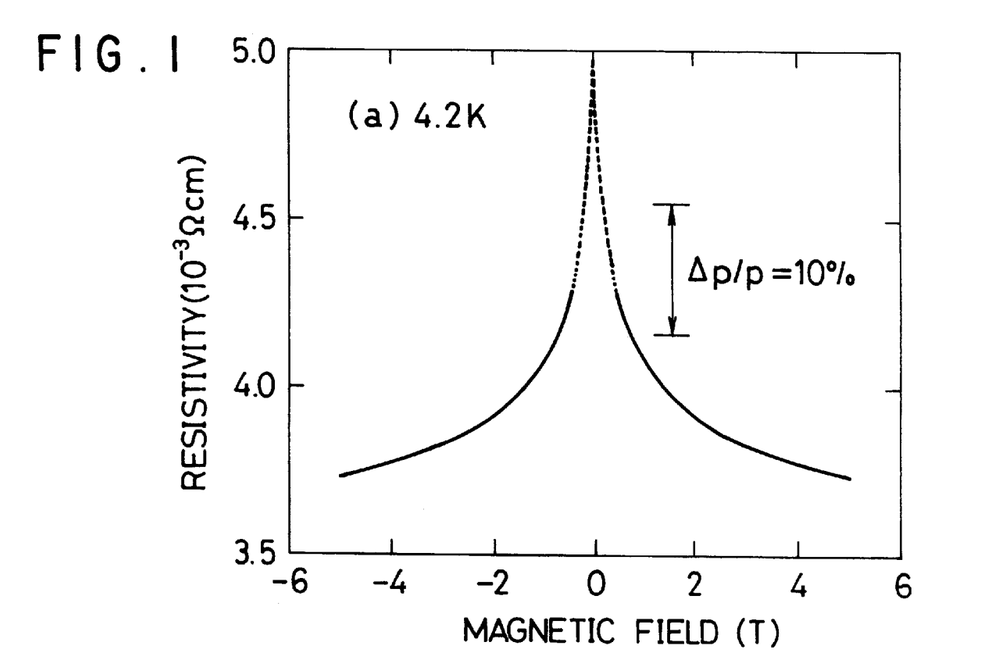
FIG. 1 is a graph showing the magnetoresistive effect of a magnetoresistor ($Sr_2FeMoO_6$) according to the present invention at a temperature of 4.2 K.
Figure 2:
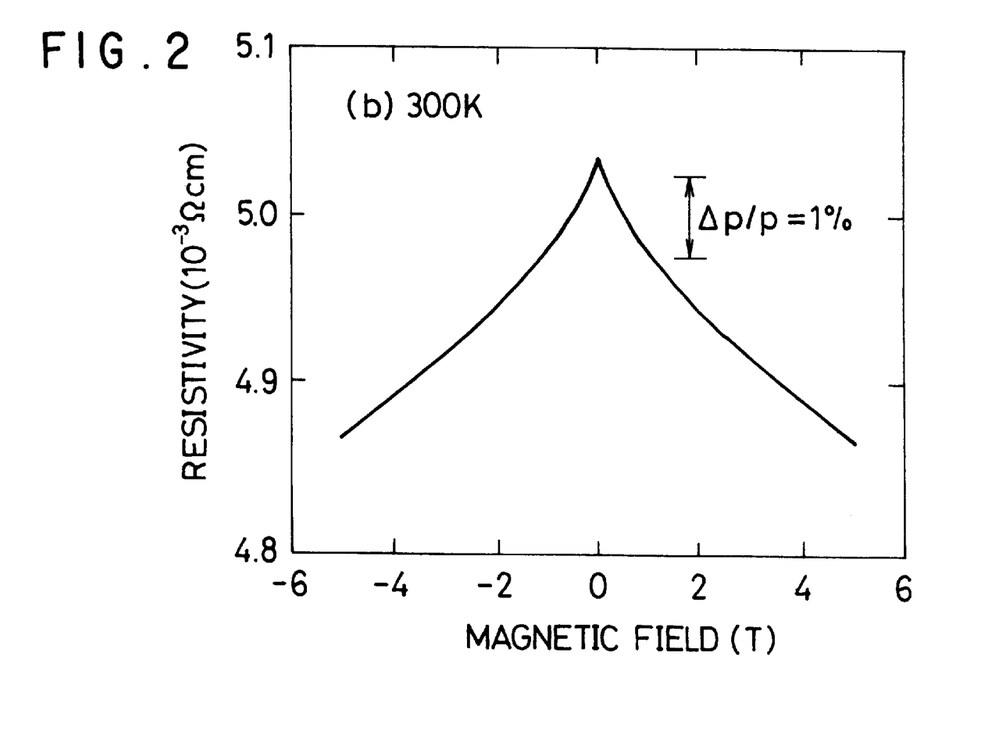
FIG. 2 is a graph showing the magnetoresistive effect of the magnetoresistor at a temperature of 300 K.

A magnetic field of up to 5 T (Tesla) was applied to samples at 4.2 K. and 300 K. to measure their magnetoresistive effects. As a result, negative magnetoresistive effects were obtained as shown in FIGS. 1 and 2.

The magnetoresistivity of each sample was obtained from equation (1):

$$MR=\Delta R/R=[R(0)-R(H)]/R(H) \quad (1)$$

wherein R(H) was a resistivity at 7 T, and R(0) was a resistivity at 9 T that was a maximum value because $Sr_2FeMoO_6$ has small retaining strength. The results were that the samples had a 32% resistivity (4.2 K.) and a 3.5% resistivity (300 K.), respectively.

Figure 4:
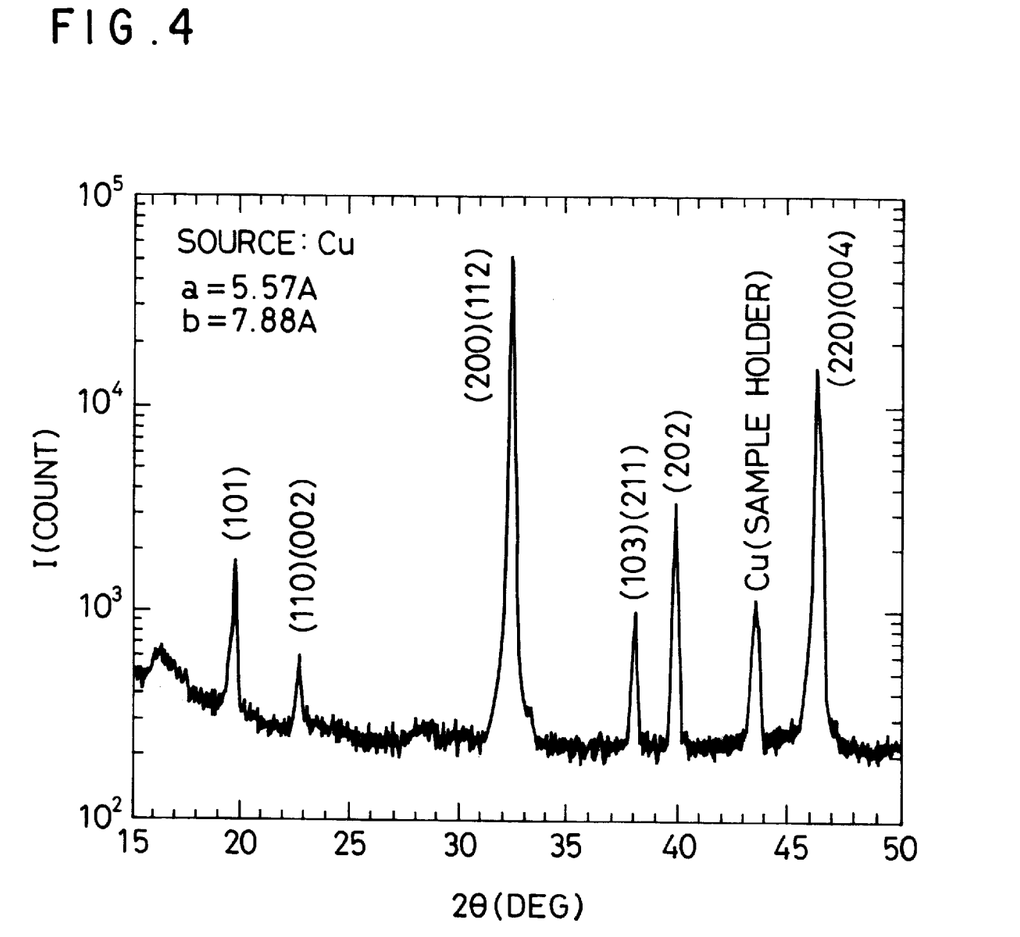
FIG. 4 is a chart showing a powder X-ray diffraction pattern of the magnetoresistor measured at room temperature.
Figure 5:
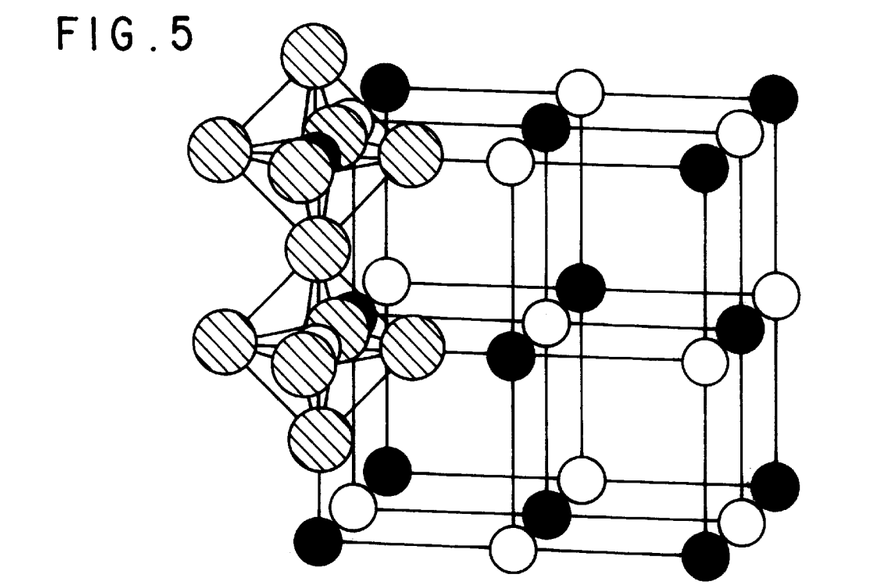
FIG. 5 is a perspective view showing the atom arrangement in the ordered double perovskite crystal structure of a magnetoresistor according to the present invention.

The polycrystal oxide ceramics thus obtained were analyzed by the powder X-ray diffraction analysis to find that they were tetragonal system crystals having a=5.57 Å and c=7.88 Å. The X-ray diffraction peak was found as an index of (101) at 2θ=19.66° as shown in FIG. 4. This revealed that the Fe atoms and the Mo atoms in the ordered double perovskite structure were alternately arranged as shown in FIG. 5 in which solid circles denote Fe atoms, blank circles denote Mo atoms, and circles with obliques therein denote 0 atoms and in which Sr atoms exist in the centers of 8 cubes and have been omitted from illustration. In FIG. 4, the relative strength of the X-ray diffraction peak indexed as (101) to the maximum X-ray diffraction peak indexed as (200)(112) indicates a degree of alternate arrangement of the Fe atoms and the Mo atoms.

In case where a degree of alternate arrangement was 100%, the relative strength ratio of the peak (101) to the peak (200)(112) was 100:4.8 (4.8%). This relative strength ratio and the magnetoresistive effect have a correlation. When the ratio was 100:2.1 (a 42% degree of alternate arrangement), the magnetoresistive effect obtained from equation (1) at 4.2 K. was 44%. When the ratio was 100:1.3 (a 27% degree of alternate arrangement), the effect obtained from equation (1) at 4.2 K. was 19%. When the ratio was 100:0.9 (a 19% degree of alternate arrangement), the effect obtained from equation (1) at 4.2 K. was 10%.

It was found from these results that in order to obtain a magnetoresistor having a magnetoresistive effect of not less than 10% at 4.2 K. it was necessary for the degree of alternate arrangement of Fe atoms and Mo atoms to be not less than 20%.

COMPARATIVE EXPERIMENT 1

The second disc obtained in Working Example 1 was sintered at 1300° C. in a stream of argon gas containing 7% of $H_2$ gas for 25 hours. The sintered article obtained did not have a magnetoresistive effect. When the sintering time was set to be not more than 1 hour, the sintered article obtained had insufficient strength.

WORKING EXAMPLE 2

In a glove compartment, fully dried materials of SrO, $Fe_2O_3$, $Re_2O_7$ and Re powder were weighed so that a composition of $Sr_2FeReO_6$ could be obtained. These materials were mixed therein using a agate mortar and molded therein under a pressure of about 0.3 ton to 1.0 ton/cm² into a disc 10 mm in diameter and 1 mm in thickness.

The disc thus obtained was immediately sealed in an evacuated silica capsule, calcined at 900° C. for 3 hours, then cooled to room temperature, thereafter pulverized minutely, and re-molded under a pressure of about 0.3 ton to 1.0 ton/cm² into a second disc 10 mm in diameter and 1 mm in thickness.

The second disc was immediately sealed in the evacuated silica capsule, sintered at 1200° C. for 3 hours, cooled to room temperature, and taken out. The resultant disc was heat-treated at 1200° C. in a stream of argon gas for 3 hours, and cut into square pole samples measuring about 1 mm×1 mm×5 mm for measurement of electroresistivity.

Figure 8:
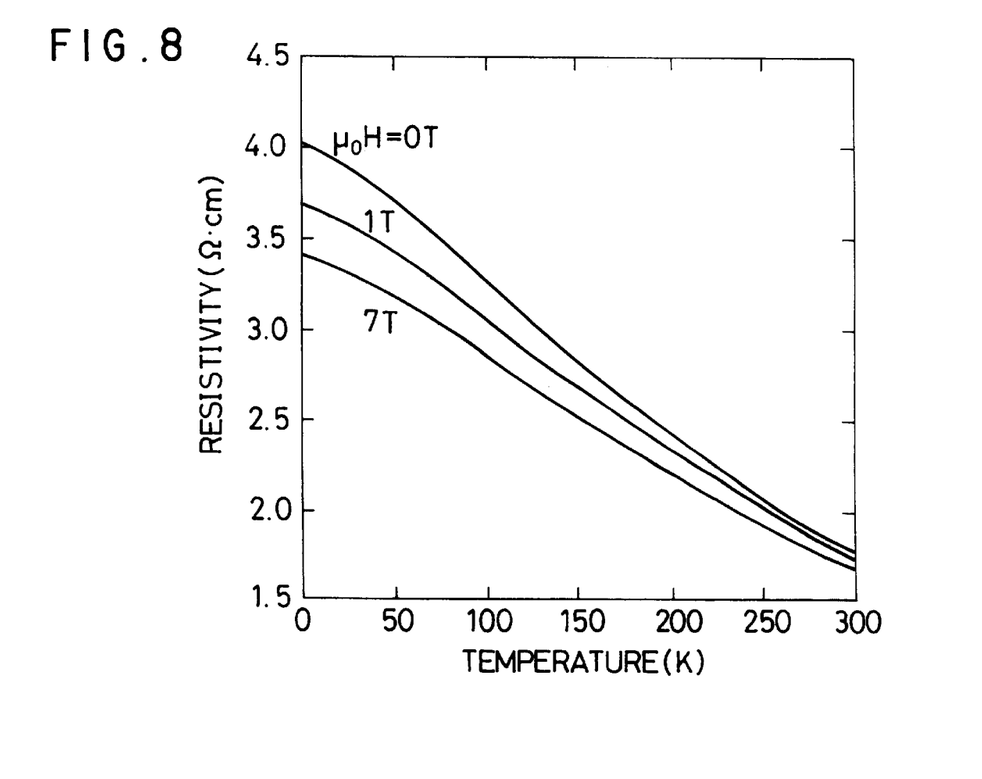
FIG. 8 is a graph showing the temperature dependency of the electroresistivity of the magnetoresistor of FIG. 6 at a temperature range of 2 K. to 300 K.

A polycrystal oxide ceramic sample was assayed for temperature dependency of electroresistivity using the direct-current four-terminal method. As shown in FIG. 8, there was observed a negative magnetoresistive effect over a temperature range of not more than room temperature to 2 K. wherein the resistivity decreased with an increasing magnetic field applied.

Figure 6:
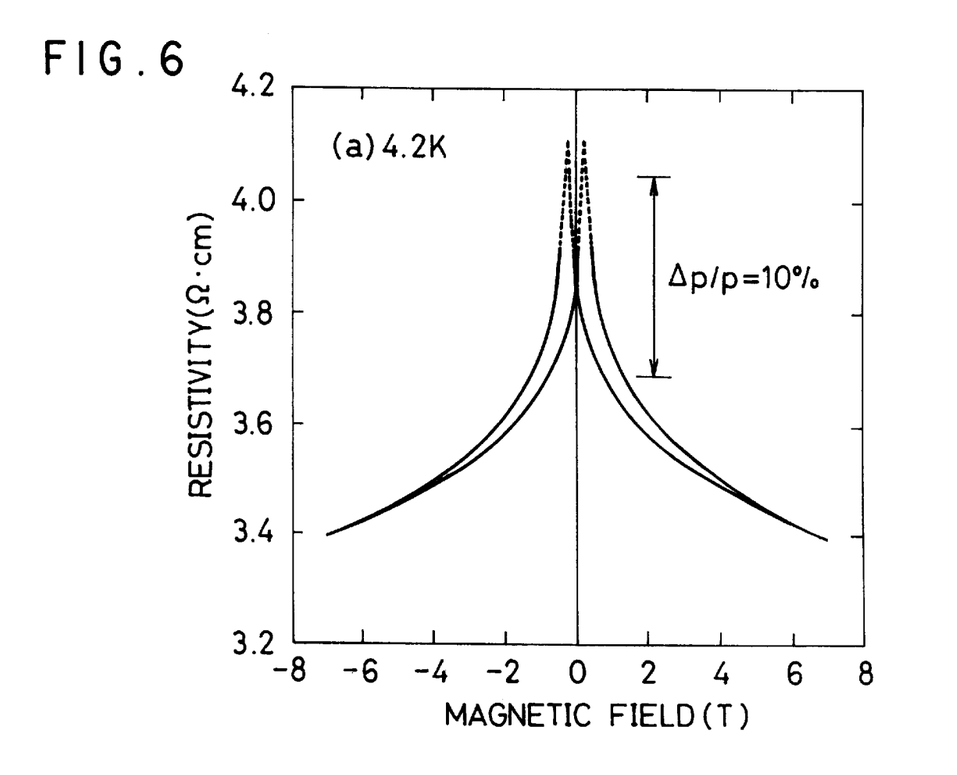
FIG. 6 is a graph showing the magnetoresistive effect of a magnetoresistor ($Sr_2FeReO_6$) according to the present invention at a temperature of 4.2 K.
Figure 7:
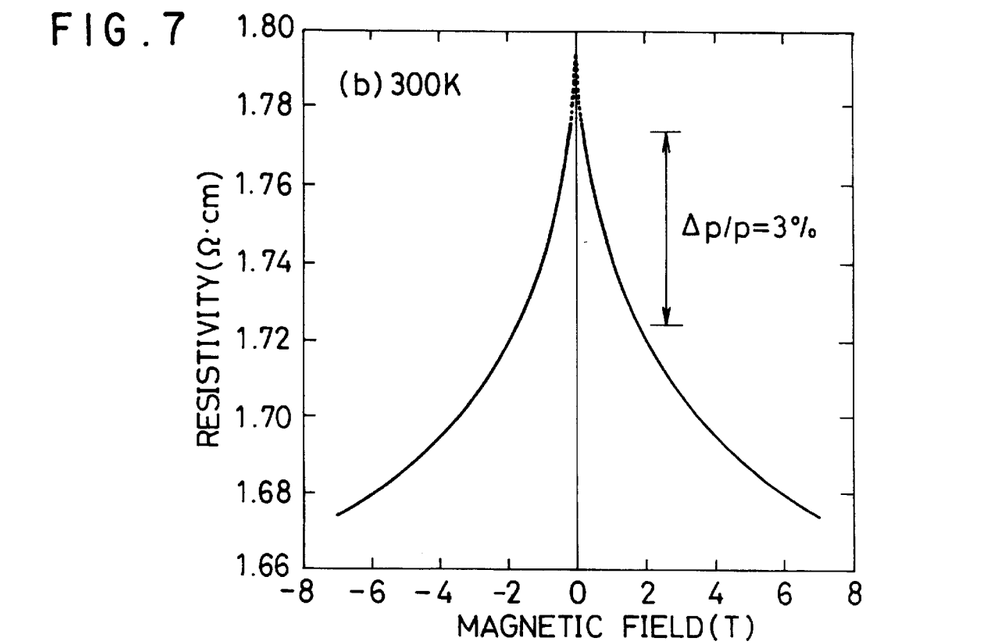
FIG. 7 is a graph showing the magnetoresistive effect of the magnetoresistor of FIG. 6 at a temperature of 300 K.

A magnetic field of up to 7 T (Tesla) was applied to samples at 4.2 K. and 300 K. to measure their magnetoresistive effects. As a result, negative magnetoresistance curves as shown in FIGS. 6 and 7 were obtained. Using these curves the magnetoresistivity of each sample was obtained from equations (2) and (3):

$$MR = R/R = [R(0.2) - R(H)]/R(H) \text{ at } 4.2 \text{ K.} \quad (2)$$

$$MR = R/R = [R(0.05) - R(H)]/R(H) \text{ at } 300 \text{ K.} \quad (3)$$

where R(H) was a resistivity at 7 T, R(0.2) was a resistivity at 0.2 T of $Sr_2FeReO_6$ at the maximum value of 4.2 K., and T(0.5) was a resistivity at 0.05 T of $Sr_2FeReO_6$ at the minimum value of 300 K. The results were that the samples had a 21.1% resistivity (4.2 K.) and a 7.2% resistivity (300 K.), respectively.

Figure 9:
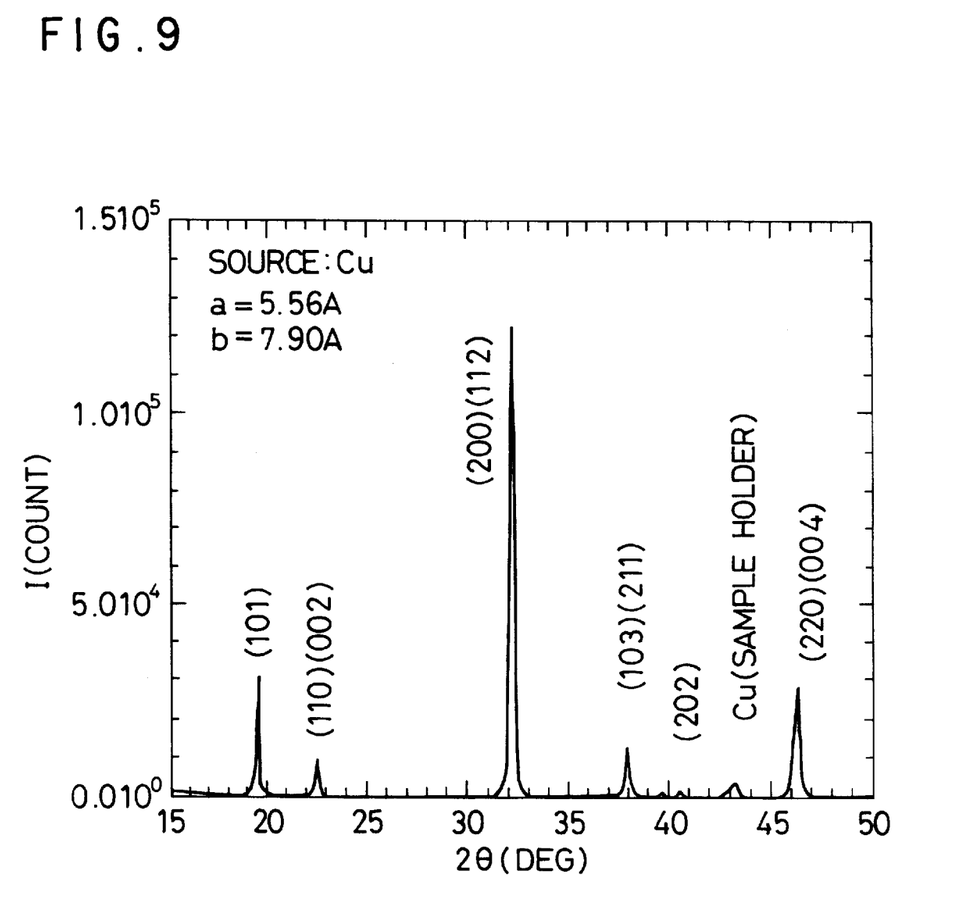
FIG. 9 is a chart showing a powder X-ray diffraction pattern of the magnetoresistor of FIG. 6 measured at room temperature.

The polycrystal oxide ceramics thus obtained were analyzed by the powder X-ray diffraction analysis to find that they were tetragonal system crystals have a=5.56 Å and c=7.90 Å. As shown in FIG. 9 the X-ray diffraction peak was found as an index of (101) at 2θ=19.50°. This revealed that the Fe atoms and the Re atoms were alternately arranged as shown in FIG. 5 wherein the blank circles denote Re atoms in Working Example 2 instead of the Mo atoms in Working Example 1 to form an ordered double perovskite structure. Returning to FIG. 9, the relative strength ratio of the X-ray diffraction peak indexed as (101) to the maximum X-ray diffraction peak indexed as (200)(112) indicates a degree of alternate arrangement of the Fe atoms and the Re atoms in the ordered double perovskite structure. The powder X-ray diffraction results shown in FIG. 9 was subjected to the Rietveld analysis to find that a degree of alternate arrangement of the Fe atoms and the Re atoms in the structure was 97%. The relative strength ratio of the peak (101) to the peak (200)(112) obtained by the Rietveld analysis was 100:25 (25%). This relative strength ratio and the magnetoresistive effect had a correlation. When a sample having a 42% degree of alternate arrangement, the magnetoresistive effect at 4.2 K. obtained from equation (2) was 9.5%. In the case of a sample having a 24% degree of alternate arrangement, the magnetoresistive effect at 4.2 K. obtained from equation (2) was 5.3%. Similarly in the case of a sample having a 19% degree of alternate arrangement, the magnetoresistive effect at 4.2 K. obtained from equation (2) was 3.8%.

It was found from these results that in order to obtain a magnetoresistor having a magnetoresistive effect of not less than 5% at 4.2 K. it was necessary for the degree of alternate arrangement of Fe atoms and Re atoms to be not less than 20%.

COMPARATIVE EXPERIMENT 2

The article obtained in Working Example 2 was heat-treated at not more than 1125° C. in a stream of inert gas. The resultant article did not have a negative huge magnetoresistive effect in an entire temperature range of not more than room temperature. When the calcining and primary sintering treatments were effected without sealing the article in an evacuated silica capsule, the sample obtained had a composition different from a target one.

What is claimed is:

1. A magnetoresistor with an ordered double perovskite structure that is an oxide polycrystal:

which has an ordered double perovskite crystal structure represented by $Sr_2FeReO_6$ and wherein said Fe atoms and said Re atoms have a degree of alternate arrangement in the range of 20% to 100%, and which exhibits negative magnetoresistive characteristics.

2. A method for producing an oxide having an ordered double perovskite crystal structure represented by a composition of $Sr_2FeReO_6$, comprising the steps of:

weighing, mixing and forming raw material powders in a glove compartment to obtain a desired shaped article having said composition;

sealing said article in an evacuated silica capsule;

calcining said article within the silica capsule at a temperature of about 900° C.;

primarily sintering the calcined article at a temperature of not less than 1100° C.; and heat-treating the sintered article in a stream of inert gas a temperature of not less than 1125° C.

3. An electronic device switching method comprising the step of:

applying a magnetic field to an oxide crystal having an ordered double perovskite crystal structure represented by the general formula of $A_2BB'O_6$, wherein A stands for Sr atoms, B for Fe atoms and B' for Mo or Re atoms and wherein said Fe atoms and said Mo or Re atoms are alternately arranged, thereby affording negative magnetoresistive characteristics to the oxide crystal.

* * * * *

UNITED STATES PATENT AND TRADEMARK OFFICE
CERTIFICATE OF CORRECTION

PATENT NO. : 6,137,395
DATED : October 24, 2000
INVENTOR(S): Keiichiro Kobayashi, et al.

It is certified that an error appears in the above-identified patent and that said Letters Patent is hereby corrected as shown below:

On the title page, Item [30], the Foreign Application Priority Date is listed incorrectly. Item [30] should read as follows:

[30]   Foreign Application Priority Data

Mar. 27, 1998  [JP]  Japan .......................... 10-81284
  Oct. 16, 1998  [JP]  Japan ..........................10-295810

Signed and Sealed this

Fifteenth Day of May, 2001

Attest:

NICHOLAS P. GODICI

Attesting Officer       Acting Director of the United States Patent and Trademark Office